United States Patent [19]

Urabe et al.

[11] Patent Number: 4,874,686
[45] Date of Patent: Oct. 17, 1989

[54] PHOTOSENSITIVE LITHOGRAPHIC PLATE NECESSITATING NO DAMPENING WATER

[75] Inventors: Yoshihiko Urabe; Tatsuji Higashi; Hiroshi Takahashi; Nobuyuki Kita, all of Shizuoka, Japan

[73] Assignee: Fuji Photo Film Co., Ltd., Minami-ashigara, Japan

[21] Appl. No.: 322,511

[22] Filed: Mar. 13, 1989

[30] Foreign Application Priority Data

Mar. 18, 1988 [JP] Japan ................... 63-65038

[51] Int. Cl.$^4$ .................. G03C 1/68; G03C 1/70; G03C 1/71
[52] U.S. Cl. .................... 430/272; 430/303; 430/287; 430/285; 430/283
[58] Field of Search .............. 430/272, 303, 287, 285, 430/283

[56] References Cited

FOREIGN PATENT DOCUMENTS 1442374 7/1976 United Kingdom ............... 430/303

Primary Examiner—Paul R. Michl
Assistant Examiner—Cynthia Hamilton
Attorney, Agent, or Firm—Burns, Doane, Swecker & Mathis

[57] ABSTRACT

The present invention relates to a photosensitive lithographic plate necessitating no damping water, which plate has an excellent image reproducibility and stability in the lapse of time. The plate comprises, on a support, a photosensitive layer and a silicone rubber layer in this order, the silicone rubber layer being formed by addition reaction of an SiH group with a —CH=CH- group to cause crosslinking, and the photosensitive layer comprising:

(1) a polymer comprising at least a structural formula (I):

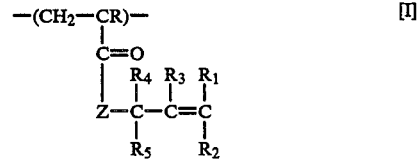

wherein R represents a hydrogen atom or a methyl group; $R_1$, $R_2$, $R_3$, $R_4$ and $R_5$ each represents a member selected from the group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group and an arylsulfo group; and Z represents an oxygen atom, a sulfur atom, —NH-, —NR$_6$ (R$_6$ represents an alkyl group), —OCH$_2$CH$_2$O- or —OCH$_2$CH(OH)-, and (2) a photopolymerization initiator.

12 Claims, No Drawings

PHOTOSENSITIVE LITHOGRAPHIC PLATE NECESSITATING NO DAMPENING WATER

BACKGROUND OF THE INVENTION

1. Field of the Invention

The present invention relates to a lithographic plate which necessitates no dampening water for the printing.

2. Prior Art

Many lithographic plates which necessitate no dampening water for the printing (hereinafter referred to as "waterless lithographic plate") have been already invented. They are described in, for example, U.S. Pat. Nos. 3,677,178, 3,511,178, 3,865,588, 3,894,873 and 4,342,820, and British Pat. No. 1,419,643. In particular, the photosensitive layers of positive working lithographic plates are usually classified into two types, i.e. one type is photopolymerization type photosensitive layers disclosed in Japanese Patent Publication for Opposition Purpose (hereinafter referred to as "J. P. KOKOKU") Nos. 54-26923 and 56-2310 and the other is photo-dimerization type photosensitive layers disclosed in J. P. KOKOKU No. 55-22781.

When the lithographic plate having the photo polymerization-type photosensitive layer is exposed to light, the silicone layer is photo-adhered to the photosensitive layer. Therefore, there is no need to add an adhesion assistant (such as a silane coupling agent) to the silicone rubber layer in order to facilitate the adhesion between the rubber layer and the photosensitive layer. In case of such a photo-adhesion, only the silicone rubber layer can be removed from the unexposed area without dissolving the photopolymerization layer, by developing the plate with a solvent capable of swelling the silicone layer. However, the reproducibility of halftone dots in the shadow area, in which the quantity of light is insufficient, is not always sufficient, because the photo-adhesion technique is essentially employed in this image-forming process. In order to solve this problem, there has been proposed a process wherein a adhesion assistant such as an aminosilane coupling agent is incorporated in the silicone rubber layer to firmly bond this layer with the photosensitive layer, and wherein a developer capable of dissolving the photosensitive layer is used to dissolve the photopolymerization layer together with the rubber layer in the unexposed area to form an image. Although the reproducibility of the halftone dots in the shadow area is improved by this process, the halftone dots in the highlight area become poor with the elapse of time, because the adhesion power between the photosensitive layer and the silicone rubber layer is gradually increased and the developability is deteriorated.

In the lithographic plate having the photodimerization-type photosensitive layer, it is necessary to incorporate an adhesion assistant such as a silane coupling agent in the silicone rubber layer in order to firmly and previously bond the silicone rubber layer with the photosensitive layer, because a sufficient photo-adhesion is not obtained unlike the lithographic plate having the photopolymerization-type photosensitive layer. The lithographic plate of this type also has a defect that the reproducibility of the halftone dots in the highlight area is deteriorated with the elapse of time.

SUMMARY OF THE INVENTION

Accordingly, the object of the present invention is to provide a waterless lithographic plate having an excellent image reproducibility and stability in the lapse of time.

After intensive investigations made for the purpose of attaining the above-described object, the inventors have found out that the above object is accomplished by a lithographic plate comprising, on a support, a photosensitive layer and a silicone rubber layer in this order, the rubber layer being by addition reaction of an $\rightarrow$ SiH group with a —CH=CH— group to cause the crosslinking, the photosensitive layer being formed from a photopolymerizable composition comprising a polymer having an allyl group in its side chain and a photo polymerization initiator. The present invention has been completed on the basis of this finding.

Namely, the present invention relates to a photosensitive waterless lithographic plate which comprises, on a support, a photosensitive layer and a silicone rubber layer in this order, the rubber layer being formed by addition reaction of an $\rightarrow$ SiH group with a —CH=CH— group to cause crosslinking, characterized in that the photosensitive layer comprises:

(1) a polymer comprising at least a structural unit of the following general formula (I):

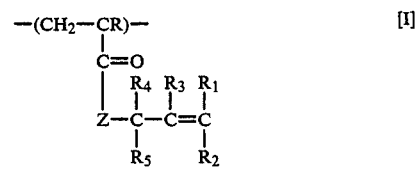

wherein R represents a hydrogen atom or a methyl group; $R_1$, $R_2$, $R_3$, $R_4$ and $R_5$ each represents a group selected from a group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group and an arylsulfo group; and Z represents an oxygen atom, a sulfur atom, —NH—, —NR$_6$— (R$_6$ represents an alkyl group), —OCH$_2$CH$_2$O— or —OCH$_2$CH(OH)—, (2) optionally, a monomer or oligomer having at least one photopolymerizable ethylenically unsaturated double bond, and (3) a photopolymerization initiator.

Now the present invention will be described in detail.

The present photosensitive waterless lithographic plate must have a flexibility sufficient for setting it on an ordinary printing machine and a strength sufficient for withstanding the load applied during the printing. Therefore, typical examples of the support include coated papers, metallic sheets, plastic films such as polyethylene terephthalate films, rubber plates, and composite materials thereof.

The surface of the support may be coated to form a primer layer and other layers in order to prevent halation or for other purposes.

The primer layer may be formed by (1) curing one of various photosensitive polymers as described in Japanese Patent Unexamined Published Application (hereinafter referred to as "J. P. KOKAI") No. 60-229031 by exposing it prior to the formation of the photosensitive layer, (2) thermosetting an epoxy resin as described in J. P. KOKAI No. 62-50760, or (3) curing a gelatin layer as described in J. P. KOKAI No. 63-133153 (GB 2199415A). Further, a cured casein layer is also usable.

The primer layer may contain additivs such as a dye, a printing-out agent, a polymerizable monomer as a photoadhesion, and a photopolymerization initiator, in order to prevent the halation or for other purposes. The thickness of the primer layer is usually 2 to 10 g/m². The polymer comprising a structural unit having the above general formula (I) and constituting the photosensitive layer of the present invention is produced by copolymerizing a monomer having the following general formula (Ia):

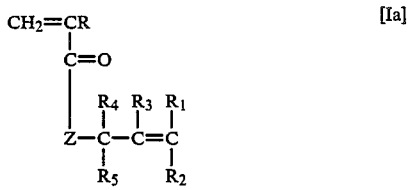

wherein R represents a hydrogen atom or a methyl group; $R_1$, $R_2$, $R_3$, $R_4$ and $R_5$ each represents a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group or an arylsulfo group; and Z represents an oxygen atom, a sulfur atom, —NH—, —NR$_6$—, ($R_6$ represents an alkyl group), —OCH$_2$CH$_2$O— or —OCH$_2$CH(OH)—, with another monomer such as acrylic acid, methacrylic acid, itaconic acid, crotonic acid, an alkyl acrylate, an alkyl methacrylate, benzyl methacrylate, 2-hydroxyethyl methacrylate, acrylonitrile, acrylamide, methacryloyloxyethyl phthalate, tetrahydroxyfurfuryl methacrylate, dicyclopentenyloxyethyl methacrylate, N,N'-diethylaminoethyl methacrylate, styrene, vinyltoluene or hydroxystyrene.

Examples of preferred monomers having the formula (Ia) include allyl acrylate, allyl methacrylate,

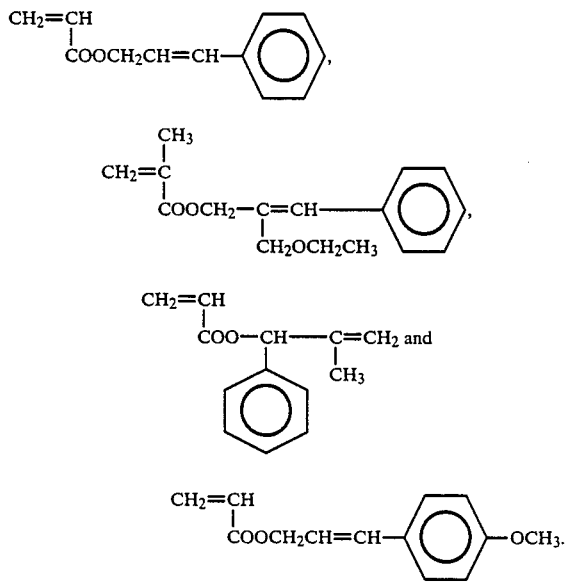

Among these copolymers, particularly preferred are those produced by copolymerizing a monomer of the general formula (Ia) with an unsaturated carboxylic acid monomer. Further, products produced by neutralizing these copolymers with a monovalent alkali metal hydroxide or an organic amine are also usable. Examples of these copolymers include those having, in their side chain, an unsaturated double bond and a carboxyl group, as described in U.S. Pat. No. 4,511,645, and products produced by neutralizing them with an alkali metal hydroxide or an organic amine. Among them, particularly preferred are copolymers of allyl methacrylate with methacrylic acid, and their products produced by neutralizing them with an alkali.

The acid value of these copolymers before or after the neutralization with the alkali is preferably at least 20. When the acid value is less than 20, their solubility in an aqueous alkali solution or their neutralized product in water is poor.

The amount of the structural unit having the formula (I) is preferably 10 to 90 molar %, more preferably 40 to 90 molar %, based on the copolymer. The molecular weight of the copolymer is 10,000 to 500,000, preferably 20,000 to 200,000.

The monomer or oligomer having at least one photopolymerizable ethylenically unsaturated double bond optionally used in the present invention includes, for example, monofunctional acrylates and methacrylates such as polyethylene glycol mono(meth)acrylate, polypropylene glycol mono(meth)acrylate and phenoxyethyl (meth)acrylate; polyfunctional acrylates and methacrylates such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, trimethylolpropane tri(acryloyloxypropyl) ether, tri(acryloyloxyethyl) isocyanurate, calcium (meth)acrylate, barium (meth)acrylate, compounds produced by changing ethylene oxide or propylene oxide to an additive with a polyfunctional alcohol such as glycerol or trimethylolethane and converting it into a (meth)acrylate thereof, urethane acrylates described in J. P. KOKOKU Nos. 48-41708 and 50-6034 and J. P. KOKAI No. 51-37193, polyester acrylates described in J. P. KOKAI No. 48-64183 and J P. KOKOKU Nos. 49-43191 and 52-30490, and epoxy acrylates produced by reacting an epoxy resin with (meth)acrylic acid; and N-methylolacrylamido derivatives described in U.S. Pat. No. 4,540,649. Further, photosetting monomers and oligomers described on pages 300 to 308 of "Nippon Setchaku Kyokaishi (Journal of The Adhesion Society of Japan)", Vol. 20, No. 7 are usable.

The ratio of the monomer or oligomer to the polymer (1) is preferably 0:10 to 7:3, more preferably 1.5:8.5 to 5:5.

The photopolymerization initiator usable in the present invention includes vicinal polyketaldonyl compounds described in U.S. Pat. No. 2,367,660, α-carbonyl compounds described in U.S. Pat. Nos. 2,367,661 and 2,367,670, acyloin ethers described in U.S. Pat. No. 2,448,828, aromatic acyloin compounds which are substituted with an α-hydrocarbon and described in U.S. Pat. No. 2,722,512, polynuclear quinone compounds described in U.S. Pat. Nos. 3,046,127 and 2,951,758, a combination of a triarylimidazole dimer with p-aminophenyl ketone described in U.S. Pat. No. 3,549,367, benzothiazole compounds described in U.S. Pat. No. 3,870,524, a combination of a benzothiazole compound with a trihalomethyl-s-triazine compound described in U.S. Pat. No. 4,239,850, acridine and phenazine compounds described in U.S. Pat. No. 3,751,259, oxadiazole compounds described in U.S. Pat. No. 4,212,970 and trihalomethyl-s-triazine compounds having a chromophoric group described in U.S. Pat. Nos. 3,954,475, 4,189,323, 4,619,998 and 4,772,534; British Pat. No. 1,602,903; and GB 2,195,121A.

The amount of the photopolymerization initiator is 0.1 to 20 wt. %, preferably 1 to 10 wt. %, based on the total composition of the photosensitive layer.

It is desirable to add a heat polymerization inhibitor to the composition. The heat polymerization inhibitor includes, for example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole. If necessary, a dye or a pigment for coloring the photosensitive layer or a pH indicator as the printing out agent may also be added to the composition.

The photosensitive layer composition is dissolved in a suitable solvent such as 2-methoxyethanol, 2-methoxyethyl acetate, methanol, ethanol, methyl ethyl ketone or water, or a suitable mixture of these solvents. The solution is applied to the support in an amount of about 0.1 to 10 g/m$^2$, preferably 0.5 to 5 g/m$^2$ (on dry basis).

The silicone rubber layer of the present invention is formed by addition reaction of an →SiH group with a —CH=CH— group to cause crosslinking. As compared with a condensation type silicone rubber layer, the silicone rubber layer thus formed is characterized by its excellent ink repellency. Other advantages of this silicone rubber layer are that it has an excellent adhesive strength between the photosensitive layer and the rubber layer, and that the silicone rubber layer is sufficiently cured even in the presence of a carboxylic acid, while the condensation type silicone rubber layer is not sufficiently cured in the presence of the carboxylic acid. Therefore, the present silicone rubber layer provides still another advantage that the development can be conducted with a developer mainly comprising water or an aqueous alkali solution, because the photosensitive layer can contain a carboxylic acid.

The group —CH=CH13 includes substituted or unsubstituted alkenyl, alkenylene, alkynyl and alkynylene groups having 2 to 10 carbon atoms, but it excludes an aromatic —CH=CH— bond.

The silicone rubber of the present invention is formed by reacting a polyvalent hydrogenorganopolysiloxane with a polysiloxane compound having two or more —CH=CH— bonds in the molecule. It is produced preferably by curing and crosslinking a composition comprising the following components:

(1) 100 parts by weight of an organopolysiloxane having at least two alkenyl groups (preferably a vinyl group) directly bonded with a silicon atom in the molecule, (2) 0.1 to 1000 parts by weight of an organohydrogenpolysiloxane having at least two →SiH bonds in the molecule, and (3) 0.00001 to 10 parts by weight of an addition catalyst.

The alkenyl group of Component (1) may be at position of the chain such as its end or its middle position. The organic group other than the alkenyl group includes substituted or unsubstituted alkyl and aryl groups. Component (1) may contain a very small amount of a hydroxyl group. Component (2) forms a silicone rubber by its reaction with Component (1) and it also serves as an adhesive for the photosensitive layer. The hydroxyl group of Component (2) may be at any position such as its end or middle position in the chain. The organic group other than a hydrogen atom is the same as that of Component (1). It is preferable from the viewpoint of the ink repellency that at least 60% of the organic groups of Components (1) and (2) comprise methyl groups. The molecular structures of Components (1) and (2) may be linear, cyclic or branched. It is preferable from the viewpoint of the physical properties of the rubber that at least one of Components (1) and (2) has a molecular weight of higher than 1,000 and that particularly the molecular weight of Component (1) exceeds 1,000.

Component (1) includes, for example, $\alpha,\omega$-divinylpolydimethylsiloxane and methylvinylsiloxane dimethylsiloxane copolymers having methyl groups at both ends. Component (2) includes, for example, polydimethylsiloxane 5 having hydroxyl groups at both ends, $\alpha,\omega$-dimethylpolymethylhydrogensiloxane, methylhydrogensiloxane/dimethylsiloxane copolymers having methyl groups at both ends, and cyclic polymethylhydrogensiloxane.

The addition catalyst as Component (3) is selected suitably from known ones. Particularly platinum per se and platinum compounds such as platinum chloride, chloroplatinic acid and platinum coordinated with an olefin are preferred.

A crosslinking inhibitor such as a vinyl group-having organopolysiloxane, e. g. tetracyclo(methylvinyl)siloxane or an alcohol having a carbon-to-carbon triple bond may also be added to the composition in order to control the curing velocity of the composition.

The addition reaction occurs immediately after mixing the three components of the above composition to cause curing. The curing velocity is sharply increased as the reaction temperature is elevated. This is a characteristic feature of the composition. Therefore, it is preferable from the viewpoint of the stabilization of the adhesion to the photosensitive layer that the composition is kept at a high temperature until the curing is completed while the temperature is controlled so that the characters of the support and the photosensitive layer are unchanged. At such a high temperature, the pot life of the composition is prolonged and its curing time on the photosensitive layer is shortened.

The composition may contain also a known agent which imparts high adhesion, such as an alkenyltrialkoxysilane, as well as a hydroxyl group-having organopolysiloxane which is a component of the condensation type-silicone rubber and a hydrolyzable functional group-having silane (or siloxane). Further, a known filler such as silica may be added to the composition in order to improve the rubber strength.

The silicone rubber layer of the present invention serves as a printing ink-repellent layer and its suitable thickness is 0.5 to 5$\mu$. When the thickness is less than 0.5$\mu$, the ink repellency is reduced and the rubber layer is easily scarred. On the contrary, when the thickness is more than 5$\mu$, the developability is reduced.

The silicone rubber layer of the present photosensitive lithographic plate may be further coated with a various kind of silicone rubber layer. Further, an adhesive layer may be formed between the photosensitive layer and the silicone rubber layer for the purpose of preventing the catalyst in the silicone rubber composition from serving as a catalyst poison. The silicone rubber layer may be laminated with a transparent film such as a polyethylene, polypropylene, polyvinyl chloride, polyvinylidene chloride, polyvinyl alcohol, polyethylene terephthalate or cellophane. Alternatively, the layer may be coated with a polymer in order to protect the surface of the silicone rubber layer.

The present photosensitive lithographic plate is exposed through a transparent original and then developed with a developer capable of dissolving or swelling the photosensitive layer in the image area or a developer capable of swelling the silicone rubber layer. In this step, both of the photosensitive layer and the silicone rubber layer in the image area are removed or only the silicone rubber layer in the image area is removed. Which way of removal to be taken depends on the strength of the developer.

The developers known as those for the photosensitive lithographic plate which necessitates no dampening water can be used in the present invention. A preferred developer is, for example, a solution of an aliphatic hydrocarbon such as hexane, heptane, Isopar E, H or G (trade name of Esso Kagaku Co., Ltd.), gasoline or kerosene; an aromatic hydrocarbon such as toluene or xylene; or a halogenated hydrocarbon such as trichloroethylene, to which the following polar solvent is added. Alcohol (such as methanol, ethanol or benzyl alcohol), Ether (such as methyl cellosolve, ethyl cellosolve, butyl cellosolve, methyl carbitol, ethyl carbitol, butyl carbitol or dioxane),
Ketone (such as acetone or methyl ethyl ketone), or
Ester (such as ethyl acetate, methyl cellosolve acetate, cellosolve acetate or carbitol acetate).

The developers containing the organic solvent as described above may further contain water or they may be solubilized in water by adding a surfactant or the like thereto. In addition, an alkali such as sodium carbonate, monoethanolamine, diethanolamine, triethanolamine, sodium silicate, potassium silicate, sodium hydroxide, potassium hydroxide or sodium borate may be added thereto. In some cases, city water or an aqueous alkali solution can be used as the developer.

The development and coloring of the image area can be conducted simultaneously by adding a dye such as Crystal Violet or Astrazone Red to the developer.

The development can be conducted by a known method wherein the plate surface is rubbed with a developing pad containing the above-described developer, or wherein the developer is poured onto the plate surface and it is rubbed with a developing brush. By this method, the silicone rubber layer and the photosensitive layer are removed from the image area to expose the surface of the support or the primer layer which will be an ink accepting part. Alternatively, only the silicone rubber layer in the image area is removed to expose the photosensitive layer which will be the ink accepting part.

The photosensitive lithographic plate of the present invention comprises, on the support, the photosensitive layer and the silicone rubber layer, in this order, the rubber layer being formed by addition reaction to cause crosslinking, the photosensitive layer being formed from a photopolymerizing photosensitive layer comprising a polymer of the above general formula (I); if necessary a monomer or oligomer having an ethylenically unsaturated double bond; and a photopolymerization initiator. By this construction, the present photosensitive lithographic plate has an excellent adhesion to the silicone rubber layer and an excellent tone reproducibility, and its adhesion is substantially unchanged with the elapse of time.

The following examples will further illustrate the present invention, which by no means limit the present invention.

Example 1

A primer layer composition comprising the following components was applied, in an amount of 8.0 g/m$^2$ (on dry basis), to a smooth aluminum plate having a thickness of 0.3 mm which had been degreased by an ordinary method, and then heated at 120°C. for 2 minutes to dry and cure the layer.

| | |
|---|---|
| Milk casein | 98 parts by weight |
| Glyoxal solution (40% aqueous solution; a product of Wako Junyaku Kogyo Co., Ltd.) | 2 parts by weight |
| γ-Glycidoxypropyltri-(β-methoxyethoxy)silane | 3 parts by weight |
| [Chemical structure: bis(dimethylamino)-substituted diphenyl ketone with SO$_3$Na groups] | 5 parts by weight |
| Potassium hydroxide | 4 parts by weight |
| Pure water | 2000 parts by weight |

The aluminum plate having the primer layer as described above was immersed in a dye solution having the following composition for one min to dye it, then washed with water, and dried at room temperature:

| | |
|---|---|
| H$_5$C$_2$O—[phenyl]—N=N—[phenyl(NaO$_3$S)]—S—[phenyl(SO$_3$Na)]—N=N—[phenyl]—OC$_2$H$_5$ | 1 part by weight |
| Pure water | 2000 parts by weight |

A photosensitive composition comprising the following components was applied to the aluminum plate having the dyed primer layer in an amount of 1 g/m$^2$ (on dry basis) and then dried at 100° C. for 1 min:

| | |
|---|---|
| Allyl methacrylate/methacrylic acid copolymer (83/17 molar %) (average molecular weight: 90,000) | 2 parts by weight |

-continued

| | |
|---|---|
| (CH$_2$=CHCOCH$_2$CHCH$_2$OCH$_2$)$_{\overline{2}}$CHOH<br>         ‖            ‖<br>         O        OH | 0.6 part by weight |
| (C$_2$H$_5$OCCH$_2$)$_2$N—⟨aryl-Br⟩—C(=N–N=C(CCl$_3$)–N=C(CCl$_3$))<br>         ‖<br>         O | 0.05 part by weight |
| (C$_2$H$_5$OCCH$_2$)$_2$N—⟨aryl⟩—C(=N–N=C(CCl$_3$)–N=C(CCl$_3$))<br>         ‖<br>         O | 0.15 part by weight |
| Leucocrystal Violet | 0.02 part by weight |
| [Ph–N(CH$_3$)–C$_6$H$_4$]$_2$CH–carbazole-N-nC$_4$H$_9$ | 0.02 part by weight |
| Defenser MCF 323<br>(a product of Dainippon Ink<br>& Chemicals, Inc.) | 0.02 part by weight |

Then, 2.0 g/m² (on dry basis) of a silicone rubber composition comprising the following components was applied to the photosensitive layer and then dried at 14020 C. for 2 min to form a cured silicone rubber layer:

| | |
|---|---|
| α,ω-Divinylpolydimethyl-siloxane (average molecular weight: 300,000) | 90 parts by weight |
| α,ω-Divinylpolymethyl-hydrogenpolysiloxane (average molecular weight: 2,500) | 6 parts by weight |
| KF 410 (α-methylstyrene-modified dimethylsiloxane) | 0.5 part by weight |
| Olefin/chloroplatinic acid (10% solution in toluene) | 20 parts by weight |
| Inhibitor (10% solution in toluene) | 10 parts by weight |
| Isopar G (a product of Esso Kagaku Co., Ltd.) | 1400 parts by weight |
| Toluene | 210 parts by weight |

A polyethylene terephthalate film having a thickness of 7μ, the surface of which had been matted, was laminated on the thus obtained silicone rubber layer to form a waterless photosensitive lithographic plate.

A positive film was placed on the lithographic plate and exposed (30 count) with FT 26 V UDNS ULTRA-PLUS FLIP-TOP PLATE MAKER (a product of Nuark) and then the positive film was peeled off. It was immersed in a developer comprising 8 parts by weight of benzyl alcohol, 3 parts by weight of sodium iso-propylnaphthalenesulfonate, 1 part by weight of sodium carbonate, and 88 parts by weight of water, for one minute and then lightly rubbed with a developing pad to remove the photosensitive layer and the silicone rubber layer in the unexposed area. Thus, the waterless lithographic plate, on which the image of the positive film was faithfully reproduced all over the surface, was prepared.

The plate thus prepared was used for the printing with Heidelberg GTO printing machine, of which a device for feeding dampening water had been dismantled, using TOYO KING ULTRA TUK aqualess G Sumi ink (a product of Toyo Ink Mfg. Co., Ltd.) to produce prints having the faithfully reproduced image.

EXAMPLE 2

A support comprising a 200μ polyester terephthalate film laminated with a 30μ aluminum foil on its both surfaces by means of an adhesive was used. The following primer layer composition was applied to the support, in an amount of 2.0 g/m² (on dry basis). The coated support was heated at 120° C. for 2 min to dry and cure the layer.

| | |
|---|---|
| Photographic Gelatin 680 (a product of Nitta Gelatin Co., Ltd.) | 100 parts by weight |
| | 14.4 parts by weight |
| N—(β-aminoethyl)-γ-aminopropyl-trimethoxysilane | 7 parts by weight |
| TiO$_2$/Photographic Gelatin 680/ pure water dispersion (weight ratio: 30/3/67) | 20 parts by weight |
| Tartrazine (yellow dye) | |
| (CH$_3$)$_2$N—⟨aryl⟩—C(=O)—⟨aryl-SO$_3$Na⟩—N(CH$_3$)$_2$ (with SO$_3$Na) | 2 parts by weight |

-continued

| | |
|---|---|
| Pure water | 4000 parts by weight |

After drying, the coated support was aged at room temperature (about 20° C.) for four days to stabilize the cured layer.

A photosensitive composition comprising the following components was applied to the support having the primer layer, in an amount of 100 g/m² (on dry basis), and then dried at 100° C. for 1 min:

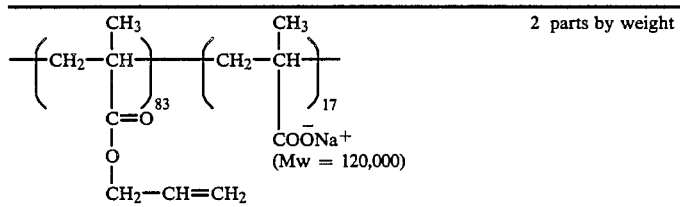  2 parts by weight

| | |
|---|---|
| Epoxy Ester 3002 A (epoxy acrylate of Kyoeisha Yushi Kagaku Kogyo Co., Ltd.) | 0.6 part by weight |

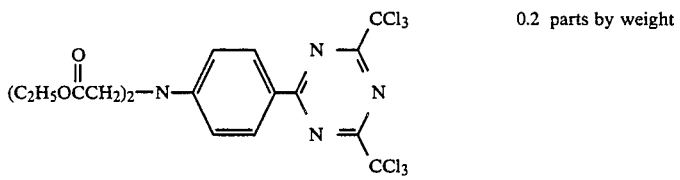  0.2 parts by weight

| | |
|---|---|
| Bromophenol Blue | 0.1 part by weight |
| Methanol Silica Sol (30 wt. % methanol) (a product of Nissan Chemical Industries, Ltd.) | 1 part by weight |
| Ethylene glycol monomethylethanol | 25 parts by weight |
| Methyl ethyl ketone | 35 parts by weight |

Then, a silicone rubber composition comprising the following components was applied to the photosensitive layer, in an amount of 1.0 g/m² (on dry basis), and dried at 140° C. for 2 min to form a cured silicone rubber layer:

| | |
|---|---|
| α,ω-Divinylpolydimethylsiloxane (average molecular weight: 300,000) | 90 parts by weight |
| Methylhydrogenpolysiloxane (average molecular weight: 2,500) | 3 parts by weight |
| KF 410 (α-methylstyrene-modified dimethylsiloxane; a product of Shin-Etsu Chemical Co., Ltd.) | 0.5 part by weight |
| Olefin/chloroplatinic acid (10% solution in toluene) | 20 parts by weight |
| Ethanol | 10 parts by weight |
| Isopar G (a product of Esso Chemical Co., Ltd.) | 1400 parts by weight |
| Toluene | 210 parts by weight |

A polyethylene terephthalate film having a thickness of 7 μm was laminated on the surface of the silicone rubber layer to form a waterless photosensitive printing plate.

The plate was exposed with Printer FT 26 V 2 UPNS (a product of Nuarc, U.S.A.) by using a 2 kW metal halide lamp as a light source (100 counts) at a distance of 1 m. After the image exposure, the film was peeled off. The plate was immersed in an aqueous developer having the following composition for one minute, and rubbed with a developing pad for 1 to 2 min, to remove the photosensitive layer and the silicone rubber layer, in the unexposed area.

| | |
|---|---|
| Benzyl alcohol | 8 parts by weight |
| Pelex NBL (38% aqueous solution of anionic surfactant; a product of Kao Atlas Co.) | 7.5 parts by weight |
| Water | 84.5 parts by weight |

The resulting waterless plate was rubbed with a dyeing solution having the following composition, to dye only the exposed area of the primer layer (image area) clear violet:

| | |
|---|---|
| Crystal Violet | 1 part by weight |
| Water | 99 part by weight |

The printing plate thus prepared was used for the printing in the same manner as that of Example 1, to obtain prints with a faithfully reproduced image.

EXAMPLE 3

A photosensitive primer solution having the following composition was applied to a degreased smooth aluminum plate having a thickness of 0.3 mm, in an amount of 4 g/m² (on dry basis) and then dried at 120° C. for 1 min.

| | |
|---|---|
| Epikote 1255-HX-30 (30% solution) [Bisphenol A/epichlorohydrin condensate (a product of Yuka Shell Epoxy Co., Ltd.)] | 5 parts by weight |
| Takenate D-110 N (75% solution) (polyfunctional isocyanate | 1.5 parts by weight |

-continued

| | |
|---|---|
| compound; a product of Takeda Chemical Industries, Ltd.) | |
| Trimethylolpropane triacrylate | 1 part by weight |
| Defenser MCF 323 (a product of Dainippon Ink & Chemicals, Inc.) | 0.02 part by weight |
| Benzanthrone | 0.2 part by weight |
| Methyl ethyl ketone | 30 parts by weight |
| Propylene glycol monomethyl ether acetate | 30 parts by weight |

Then, a water-soluble photosensitive solution having the following composition was prepared, applied to the plate in an amount of 1.0 g/m² (on dry basis) and dried at 100° C. for 1 min.

| | |
|---|---|
| Pentaerythritol triacylate | 0.7 part by weight |
| Poly(allyl methacrylate/ potassium methacrylate copolymer (molar ratio: 80/20) (molecular weight: 40,000) | 1.5 parts by weight |
| S-LEC W-201 (water-soluble polyvinyl acetal resin; a product of Sekisui Plastic Co., Ltd.) (25% aqueous solution) | 2.0 parts by weight |
| $CH_2=CHSi(OCH_2CH_2OOCH_3)_3$ | 0.1 part by weight |
| Methanol silica (30% dispersion) | 1 part by weight |

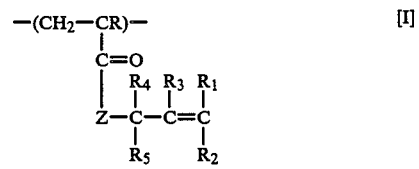

| | |
|---|---|
| | 0.1 part by weight |
| Water | 25 parts by weight |
| Methanol | 15 parts by weight |

The same silicone solution as that used in Example 2 was applied to the photosensitive layer and then dried at 40° C. for 2 min. The amount of the silicone layer after drying was 1.08 g/m².

A polyethylene terephthalate film having a thickness of 7μ was laminated on the plate prepared as described above to form a waterless photosensitive lithographic plate.

The plate was exposed in the same manner as that of Example 1 except that Fuji PS step guide was used. Then, the cover film was removed and the plate was immersed in warm water at 50° C. for 30 sec and rubbed with a sponge for 30 sec, to remove the silicone layer and the photosensitive layer in the unexposed area. Thereafter, only the primer layer in the unexposed area was dyed with a dyeing solution having the following composition, to obtain a waterless lithographic plate which exhibited an excellent tone reproducibility:

| | |
|---|---|
| Benzyl alcohol | 5 parts by weight |
| Water | 95 parts by weight |
| Victoria Pure Blue BOH | 2 parts by weight |
| Nonionic surfactant | 2 parts by weight |

What is claim is:

1. A photosensitive lithographic plate necessitating no dampening water and comprising, on a support, a photosensitive layer and a silicone rubber layer in this order, said rubber layer being formed by addition reaction of →SiH group with a —CH=CH— group to cause crosslinking, characterized in that said photosensitive layer comprises the following components:

(1) a polymer comprising at least a structural unit of the following general formula (I):

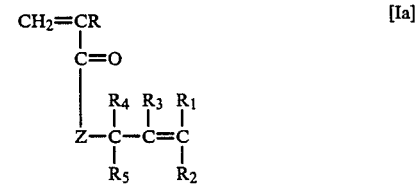

wherein R represents a hydrogen atom or a methyl group; $R_1$, $R_2$, $R_3$, $R_4$ and $R_5$ each represents a member selected from the group consisting of a hydrogen atom, a halogen atom, a carboxyl group, a sulfo group, a or anitro group, a cyano group, an amido group, an amino group, an alkyl group, an aryl group, an alkoxy group, an aryloxy group, an alkylamino group, an arylmino group, an alkylsulfonyl group and an arylsulfo group; and Z represents an oxygen atom, a sulfur atom, —NH—, —NR$_6$— (R$_6$ represents an alkyl group), —OCH$_2$CH$_2$O— or —OCH$_2$CH(OH)—, and (2) a photopolymerization initiator.

2. The photosensitive lithographic plate of claim 1, wherein said polymer is produced by copolymerizing (a) a monomer represented by the following formula:

$$\begin{array}{c} CH_2=CR \\ | \\ C=O \\ | \\ Z-\underset{R_5}{\underset{|}{C}}-\underset{}{\underset{|}{C}}=\underset{R_2}{\underset{|}{C}} \\ \phantom{Z-}R_4\phantom{-C-}R_3\phantom{-C=}R_1 \end{array} \quad [Ia]$$

wherein R represents a hydrogen atom or a methyl group; $R_1$, $R_2$, $R_3$, $R_4$ and $R_5$ each represents a member selected from the group consisting of a hydrogen atom, a halogen atom, a carboxyl group, a sulfo group, a nitro group, a cyano group, an amido group, an amino group, an alkyl group, an aryl group, an alkoxy group, an aryloxy group, an alkylamino group, an arylamino group, an alkylsulfonyl group and an arylsulfo group; and Z represents an oxygen atom, a sulfur atom, —NH13 , —NR$_6$ (R$_6$ represents an alkyl group), —OCH$_2$C-H$_2$O— or —OCH$_2$CH(OH)—, and (b) a copolymerizable monomer.

3. The photosensitive lithographic plate of claim 2, wherein said monomer (a) is selected from the group consisting of allylacrylate, allymethacryate,

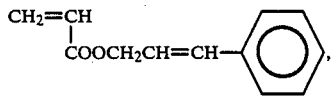

-continued

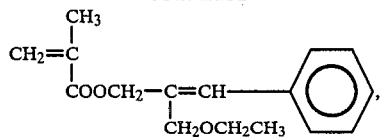

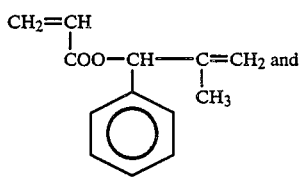

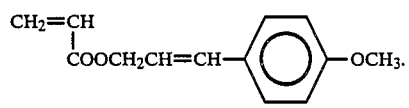

4. The photosensitive lithographic plate of claim 2, wherein said monomer (b) is selected from the group consisting of acrylic acid, methacrylic acid, itaconic acid, crotonic acid, an alkyl acrylate, an alkyl methacrylate, benzyl methacrylate, 2-hydroxyethyl methacrylate, acrylonitrile, acrylamide, methacryloyloxyethyl phthalate, tetrahydroxyfurfuryl methacrylate, dicyclopentenyloxyethyl methacrylate, N,N'-diethylaminoethyl methacrylate, styrene, vinyltoluene and hydroxystyrene.

5. The photosensitive lithographic plate of claim 4, wherein said monomer (b) is an unsaturated carboxylic acid monomer.

6. The photosensitive lithographic plate of claim 1, wherein the amount of said structural unit is 10 to 90 molar % of the polymer.

7. The photosensitive lithographic plate of claim 6, wherein said amount is 40 to 90 molar % of the polymer.

8. The photosensitive lithographic plate of claim 1, wherein the molecular weight of said polymer is 10,000 to 500,000.

9. The photosensitive lithographic plate of claim 8 wherein said molecular weight is 20,000 to 200,000.

10. The photosensitive lithographic plate of claim 1, wherein said photosensitive layer further comprises (3) a monomer or oligomer having at least one photopolymerizable ethylenically unsaturated double bond.

11. The photosensitive lithographic plate of claim 1, wherein said photopolymerization initiator (2) is contained in the photosensitive layer in an amount of 0.1 to 20% by weight.

12. The photosensitive lithographic plate of claim 11, wherein said photopolymerization initiator (2) is contained in the photosensitive layer in an amount of 1 to 10% by weight.

* * * * *